(12) United States Patent
Mallardeau et al.

(10) Patent No.: US 6,958,505 B2
(45) Date of Patent: Oct. 25, 2005

(54) INTEGRATED CIRCUIT INCLUDING ACTIVE COMPONENTS AND AT LEAST ONE PASSIVE COMPONENT ASSOCIATED FABRICATION METHOD

(75) Inventors: Catherine Mallardeau, Grenoble (FR); Pascale Mazoyer, Grenoble (FR); Marc Piazza, Pontcharra (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/955,926

(22) Filed: Sep. 18, 2001

(65) Prior Publication Data

US 2003/0034821 A1 Feb. 20, 2003

(30) Foreign Application Priority Data

Aug. 16, 2001 (FR) .............................. 01 10866

(51) Int. Cl.[7] .......................................... H01L 27/108
(52) U.S. Cl. .................... 257/296; 257/300; 257/303; 257/306; 257/265; 257/754
(58) Field of Search ................. 257/296, 306, 257/754, 265, 300, 303; 438/244, 239

(56) References Cited

U.S. PATENT DOCUMENTS

| | | | |
|---|---|---|---|
| 5,453,400 A | * 9/1995 | Abernathey et al. | ........ 438/620 |
| 5,874,756 A | 2/1999 | Ema et al. | |
| 5,959,327 A | * 9/1999 | Sandhu et al. | ........... 257/310 |
| 5,977,583 A | 11/1999 | Hosotani et al. | |
| 6,037,216 A | 3/2000 | Liu et al. | |
| 6,133,599 A | * 10/2000 | Sung et al. | ................... 257/296 |
| 6,262,446 B1 | 7/2001 | Koo et al. | |
| 6,274,424 B1 | 8/2001 | White, Jr. et al. | |
| 6,294,464 B1 | * 9/2001 | Trivedi | ....................... 438/649 |
| 6,333,535 B2 | * 12/2001 | Okumura | ................... 257/306 |
| 6,358,820 B1 | * 3/2002 | Maeda | ....................... 438/459 |
| 6,492,241 B1 | * 12/2002 | Rhodes et al. | .............. 438/386 |
| 6,677,636 B2 | * 1/2004 | Deboer et al. | .............. 257/306 |

FOREIGN PATENT DOCUMENTS

FR        2 800 199        4/2001

OTHER PUBLICATIONS

Syd. R. Wilson, Clarence J. Tracy, and John L. Freeman, Jr., "Handbook of Multilevel Metallization for Integrated Circuits," Noyes Publ., Westwood, New Jersey (1993), pp. 82–84,157,868.*
S. Wolf, "Silicon Processing for the VLSI Era: vol. 2—Process Integration," Lattice Press, Sunset Beach, CA (1990), pp. 12–13.*
Syd R. Wilson, Clarence J. Tracy, and John L. Freeman, Jr., "Handbook of Multilevel Metallization for Integrated Circuits," Noyes Publ., Westwood, New Jersey (1993), pp. 157,868.*
French Preliminary Search Report dated Jul. 3, 2002 for French Application No. 0110866.

* cited by examiner

Primary Examiner—Eddie Lee
Assistant Examiner—Thomas Magee
(74) Attorney, Agent, or Firm—Lisa K. Jorgenson; Stephen Bongini; Fleit, Kain, Gibbons, Gutman, Bongini & Bianco P.L.

(57) ABSTRACT

There is provided an integrated circuit having active components including junctions formed in a monocrystalline substrate doped locally, and at least one passive component situated above the active components. The integrated circuit includes a first insulating layer separating the active components and abase of the passive component, and a metal terminal for electrically connecting the passive component with at least one of the active components. The metal terminal is formed in the thickness of the first insulating layer and has a contact surface that projects from the limits of a junction of the one active component. In a preferred embodiment, the passive component is a capacitor. Also provided is a method of fabricating an integrated circuit that includes MOS transistors and an onboard memory plane of DRAM cells in a matrix.

19 Claims, 5 Drawing Sheets

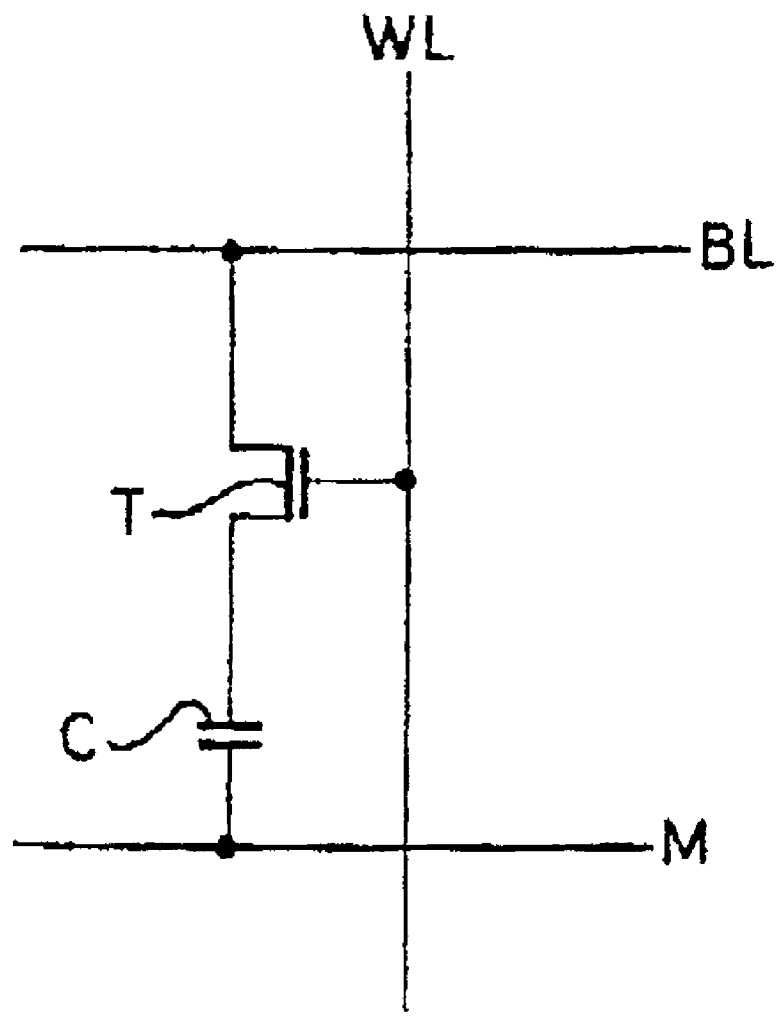
FIG_1

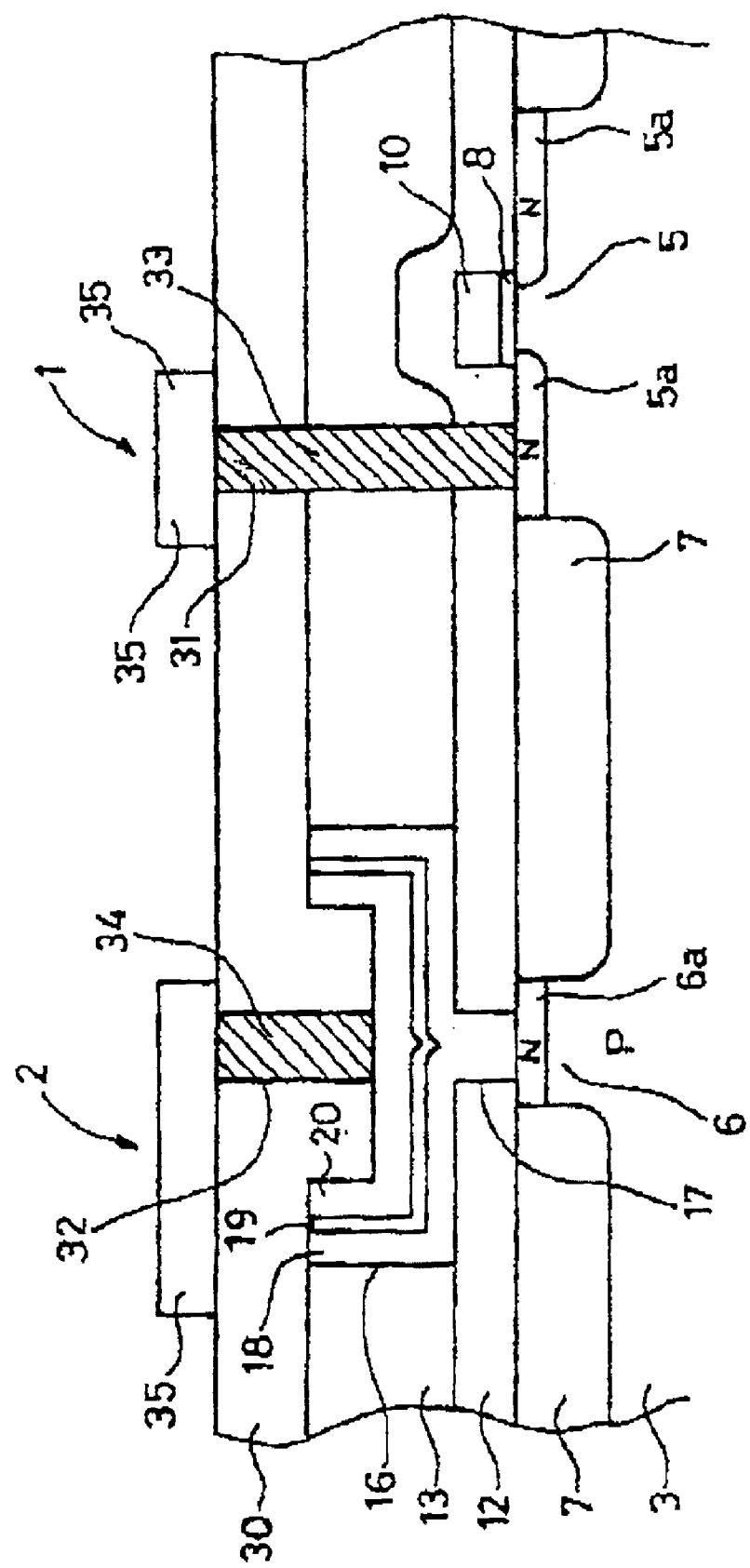
FIG_2

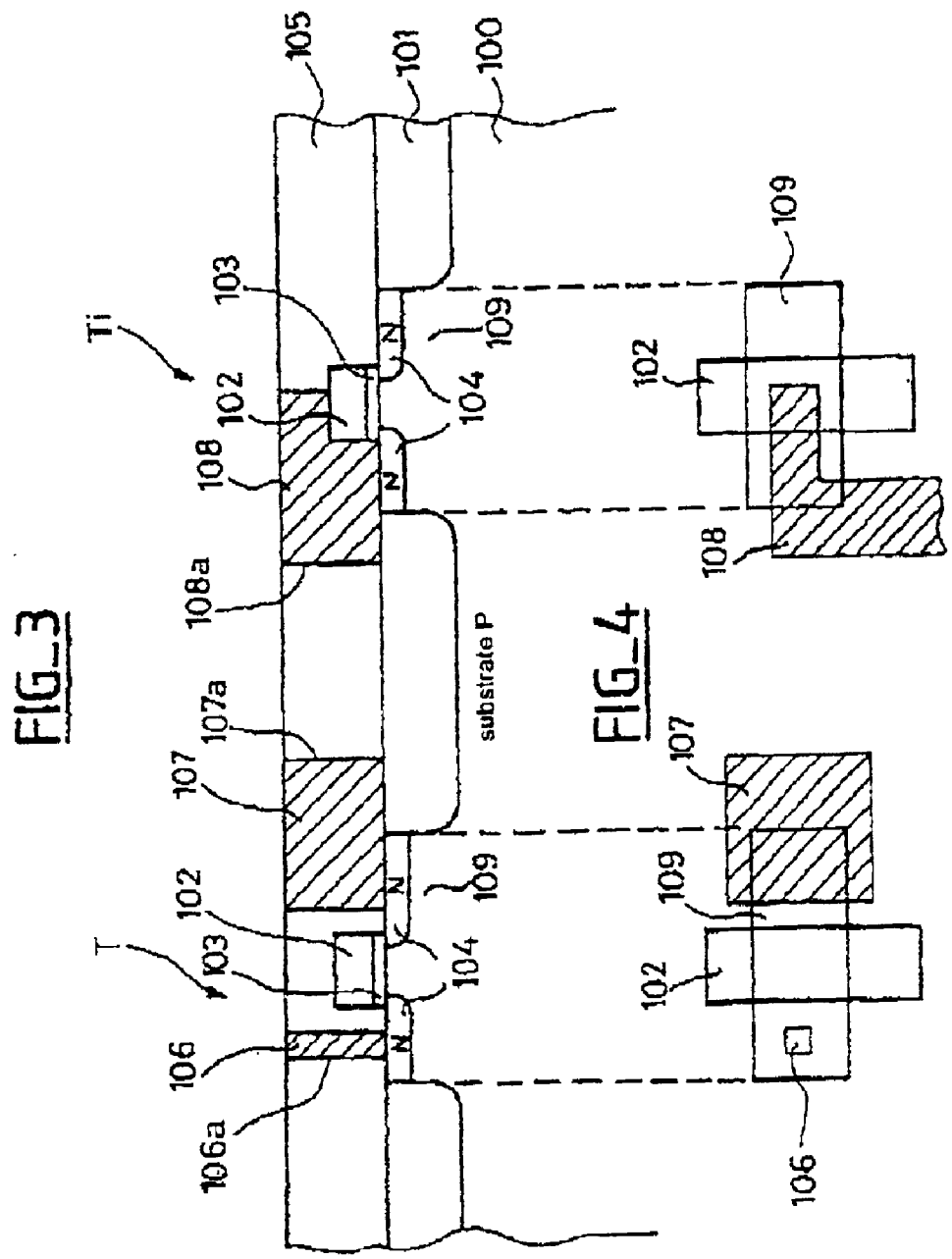

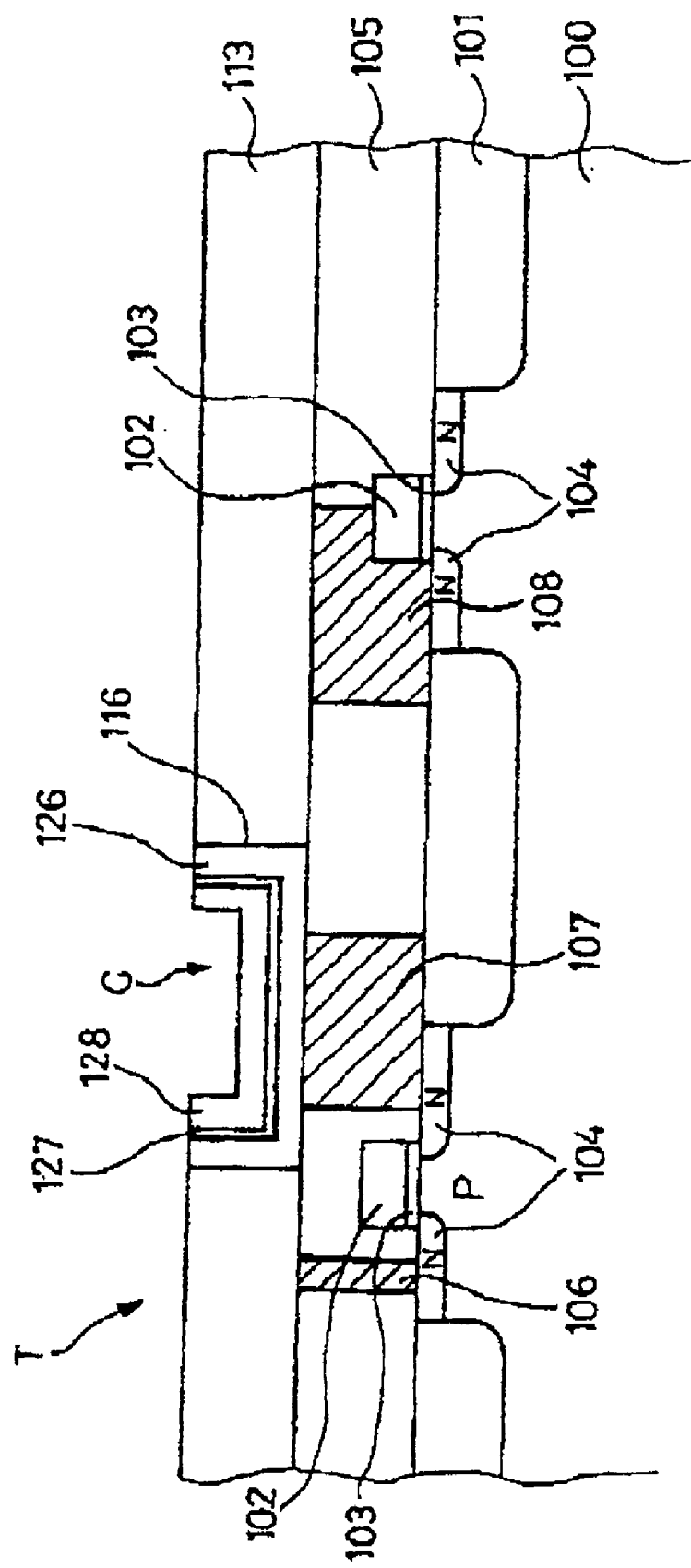
FIG_5

INTEGRATED CIRCUIT INCLUDING ACTIVE COMPONENTS AND AT LEAST ONE PASSIVE COMPONENT ASSOCIATED FABRICATION METHOD

CROSS-REFERENCE TO RELATED APPLICATIONS

This application is based upon and claims priority from prior French Patent Application No. 01-10866, filed Aug. 16, 2001, the entire disclosure of which is herein incorporated by reference.

BACKGROUND OF THE INVENTION

1. Field of the Invention

The present invention relates to integrated circuits, and more specifically to integrated circuits that include active components and at least one passive component and methods of fabricating such integrated circuits.

2. Description of Related Art

A DRAM cell consists of a control MOS transistor T and a storage capacitor C connected in series between an electrical ground M and a bit line BL, as shown in FIG. 1. The gate of the control transistor T is connected to a word line WL. The transistor T controls the flow of electrical charges between the capacitor C and the bit line BL. The electrical charge in the capacitor C determines the logic level (1 or 0) of the memory cell. When the memory cell is read, the capacitor C is discharged into the bit line BL. For fast and reliable reading of the value of the electrical charge in the storage capacitor C, the capacitance of the capacitor must be high compared to the capacitance of the bit line BL during the reading phase.

A large number of such DRAM cells are assembled in the form of a matrix to generate a memory plane that can include millions of individual cells. In some applications, the memory plane is within a complex integrated circuit. It is then referred to as an "onboard memory".

There are many ways to make the storage capacitors of the such cells of an onboard memory. In the context of integrated circuits using sub-micron MOS transistors and including an onboard DRAM plane, it is generally preferred to produce the components of the integrated circuit in the substrate first and then to produce the storage capacitor C on top of the active components, before the levels of metal interconnections. This production sequence is the most efficient for maximizing the integration density of the integrated circuit components. Thus, the whole of the surface of the silicon of the memory plane can be used for the control transistors with the electrodes of the storage capacitors grown in the height-wise direction to increase the capacitance of each capacitor.

Each storage capacitor generally consists of two conductive plates (e.g., made of doped polycrystalline silicon) separated by a dielectric layer whose thickness is on the order of 20 nm. To produce this kind of storage capacitor, one plate of the capacitor is connected to one junction of the control MOS transistor T, as shown in FIG. 1. An ohmic contact can be established between the polycrystalline silicon constituting one plate of the storage capacitor and a doped monocrystalline silicon region if the two areas have the same type of conductivity.

A conventional storage capacitor of a cell of an onboard DRAM plane will now be described in more detail. FIG. 2 shows in cross-section one example of a conventional integrated circuit including, in the right-hand part, an N-type MOS transistor 1 and, in the left-hand part, a capacitor 2 that can be used as a storage capacitor in a cell of an onboard DRAM plane. Such an integrated circuit is generally produced in the following manner.

Shallow trenches 7 filled with an insulating material are formed in a P-type monocrystalline silicon substrate 3. Monocrystalline silicon active areas 5 and 6 between the trenches are flush with the surface of the substrate. An oxide 8 is formed on the surface of the substrate and polycrystalline silicon 10 is deposited on the surface of the oxide 8. The polycrystalline silicon 10 is then etched so as to produce the control gate of the MOS transistor 1 as well as that of the other MOS transistors of the integrated circuit.

N-type dopants are implanted in a conventional manner. The implantation is masked by the polycrystalline silicon 10 so that only the uncovered portions 5a and 6a of the active areas 5 and 6 are converted into N-type silicon. A doping level (denoted "N" in FIG. 2) greater than $5\times10^{19}$ at/cm$^3$ is obtained in the uncovered areas 5a and 6a, which is propitious for forming ohmic contacts. Two insulating layers 12 and 13 are then deposited successively and are such that they can be selectively etched relative to each other. A chemical and mechanical polishing (CMP) step produces a plane surface on the external insulating layer 13. A cavity 16 is formed in the insulating layer 13 and a contact hole 17 is formed between the bottom of the cavity 16 and the surface of the active area 6a.

Polycrystalline silicon 18 is then deposited so that it fills the contact hole 17 and carpets the bottom and the sides of the cavity 16. The polycrystalline silicon 18 constitutes the first plate of the capacitor 2. It must be strongly doped to reduce spurious resistances, especially in the contact hole 17. The polycrystalline silicon 18 must have an N-type doping level of at least $5\times10^{19}$ at/cm$^3$ inside the contact hole 17. To this end, it is possible to deposit doped polycrystalline silicon in situ using the chemical vapor deposition (CVD) process. However, the dopant present during deposition greatly reduces the rate of deposition and therefore increases the cost of deposition.

Another method deposits undoped polycrystalline silicon and then dopes it by ion implantation. In this case the structure must be strongly annealed to ensure strong doping throughout the thickness of the layer and in particular in the contact hole 17. The thermal budget associated with such diffusion annealing (e.g., carried out at 950° C. for 20 minutes) may be incompatible with the production of MOS transistors with sub-micron dimensions. Additionally, the dopant of the polycrystalline silicon layer 18 must not penetrate into the active area of the underlying N-type monocrystalline silicon active area, as it would then enlarge and disrupt it. It is thus preferable to use arsenic as the dopant for the polycrystalline silicon. Arsenic has the property of not passing easily through the polycrystalline silicon/monocrystalline silicon interfaces. However, arsenic diffuses relatively little and the thermal budget must therefore be increased.

To complete the capacitor 2, an insulating deposit 19 (e.g., of silicon oxide or silicon nitride) is produced by the CVD process. A doped polycrystalline silicon layer 20 is then deposited on top of layers 18 and 19 to constitute the second plate of the capacitor 2. A CMP step eliminates any layers 18, 19, and 20 above the top surface of the insulating layer 13. One level of interconnection is then produced by carrying out the following steps. An oxide layer 30 is deposited and contact openings 31 and 32 are etched. Contact opening 31 opens onto one junction of the MOS transistor 1 and contact opening 32 opens onto the second plate 20 of the capacitor 2. The contact holes 31 and 32 are then filled with tungsten terminals 33 and 34. Finally, a metal 35 is deposited and etched to produce the first level of interconnection of the integrated circuit.

This conventional structure and fabrication process has many drawbacks. First, there are problems regarding ohmic contact between the polycrystalline silicon 18 constituting one plate of the capacitor 2 and the doped monocrystalline silicon region 6a. The resistance of the contact is high because polycrystalline silicon is resistive. Moreover, the efficiency of the contact is not very high because the technology for having direct contact between polycrystalline silicon and monocrystalline silicon is not in widespread use and the quality of the monocrystalline silicon/polycrystalline silicon interface is difficult to control and make reproducible. Additionally, with regard to the problems of efficiency, the contact surface area of the contact hole 17 is generally smaller than that of the corresponding diffusion 6a. The contact hole 17 does not extend right through and does not straddle the boundary between the active area 6a and the trench 7.

Major technological constraints are also encountered. For example, the etching of the insulating layer 13 must be selective relative to the insulating layer 12. This necessity for selectivity renders the choice of insulation critical or complicates the stacking of the insulating layers 12 and 13. The topology of the cavity 16, which is deep and narrow, makes it difficult to form the contact hole 17 at the bottom of the cavity. Furthermore, the deposition of the layer 18 constituting the first plate of the capacitor 2 is unreliable (in terms of contact quality), difficult, and costly. The relatively great thickness of the layer 18 at the location of the hole 17 constitutes an additional problem.

Further, contact hole 31 is very deep (a few micrometers) because it passes in succession through insulating layers 30, 13, and 12. The contact holes 31 and 32 have very different depths. This makes it technologically very difficult to produce this kind of contact with minimum design rules. The use of more severe design rules is therefore obligatory, and this increases the surface area of the integrated circuit.

SUMMARY OF THE INVENTION

In view of these drawbacks, it is an object of the present invention to overcome the above-mentioned drawbacks and to provide a low-resistance electrical contact between a passive component on top of transistors of an integrated circuit and underneath a first level of interconnection and another component of the integrated circuit.

Another object of the present invention is to allow the use of monocrystalline silicon to make contact with a material of a passive component that is a pollutant relative to the integrated circuit.

Yet another object of the present invention is to make reliable contacts between the storage capacitor of an onboard DRAM cell and a junction of the control transistor of that capacitor.

A further object of the present invention is to make an electrical contact between the storage capacitor of an onboard DRAM cell and a junction of the control transistor of that capacitor without using dedicated steps.

Still another object of the present invention is to facilitate producing contact openings between the first metal level of interconnection and the active components of an integrated circuit.

One embodiment of the present invention provides an integrated circuit having a plurality of active components including junctions formed in a monocrystalline substrate doped locally, and at least one passive component situated above the active components. The integrated circuit includes a first insulating layer separating the active components and abase of the passive component, and a metal terminal for electrically connecting the passive component with at least one of the active components. The metal terminal is formed in the thickness of the first insulating layer and has a contact surface that projects from the limits of a junction of the one active component. In a preferred embodiment, the passive component is a capacitor.

Another embodiment of the present invention provides an integrated circuit including a plurality of transistors, a plurality of passive components, and a level of local metal connections formed within a first insulating layer that is deposited on top of the transistors of the integrated circuit. The integrated circuit includes first, second, and third metal terminals passing completely through the thickness of the first insulating layer. The first metal terminal constitutes a first stage of contact between an active area of the integrated circuit and a first level of interconnection. The second metal terminal vertically connects an active area of the integrated circuit to a passive component resting on the first insulating layer. The third metal terminal horizontally connects two separate active areas of the integrated circuit. In one preferred embodiment, the second metal terminal has a contact surface projecting from the limits of a junction of an active component.

Yet another embodiment of the present invention provides a method of fabricating an integrated circuit that includes a plurality of MOS transistors and an onboard memory plane of DRAM cells in a matrix, with each of the cells consisting of a control transistor and a storage capacitor. According to the method, transistors are formed in a silicon substrate, and a first insulating layer is deposited on top of the transistors. Polishing is performed to produce a plane surface on the first insulating layer. Cavities are formed through the first insulating layer, and the cavities are filled with metal terminals. A bottom part of a first metal terminal is in electrical contact with at least one component of the underlying integrated circuit, a bottom part of a second metal terminal is in electrical contact with a junction of one of the control transistors, and a bottom part of a third metal terminal is in electrical contact with components of the integrated circuit to be interconnected. Additionally, a capacitor is formed above the second metal terminal such that a bottom electrode of the capacitor is in electrical contact with atop part of the second metal terminal. In a preferred method, the first, second, and third metal terminals are made principally of tungsten.

Other objects, features, and advantages of the present invention will become apparent from the following detailed description. It should be understood, however, that the detailed description and specific examples, while indicating preferred embodiments of the present invention, are given byway of illustration only and various modifications may naturally be performed without deviating from the present invention.

BRIEF DESCRIPTION OF THE DRAWINGS

FIG. 1 is a circuit diagram of a conventional DRAM cell;

FIG. 2 shows a conventional integrated circuit in cross-section;

FIG. 3 shows in cross-section a step in the fabrication of an integrated circuit in accordance with a preferred embodiment of the present invention;

FIG. 4 is a top view of a portion of the integrated circuit of FIG. 3;

FIG. 5 shows in cross-section another step in the fabrication of an integrated circuit in accordance with the preferred embodiment.

DETAILED DESCRIPTION OF PREFERRED EMBODIMENTS

Figure 6:
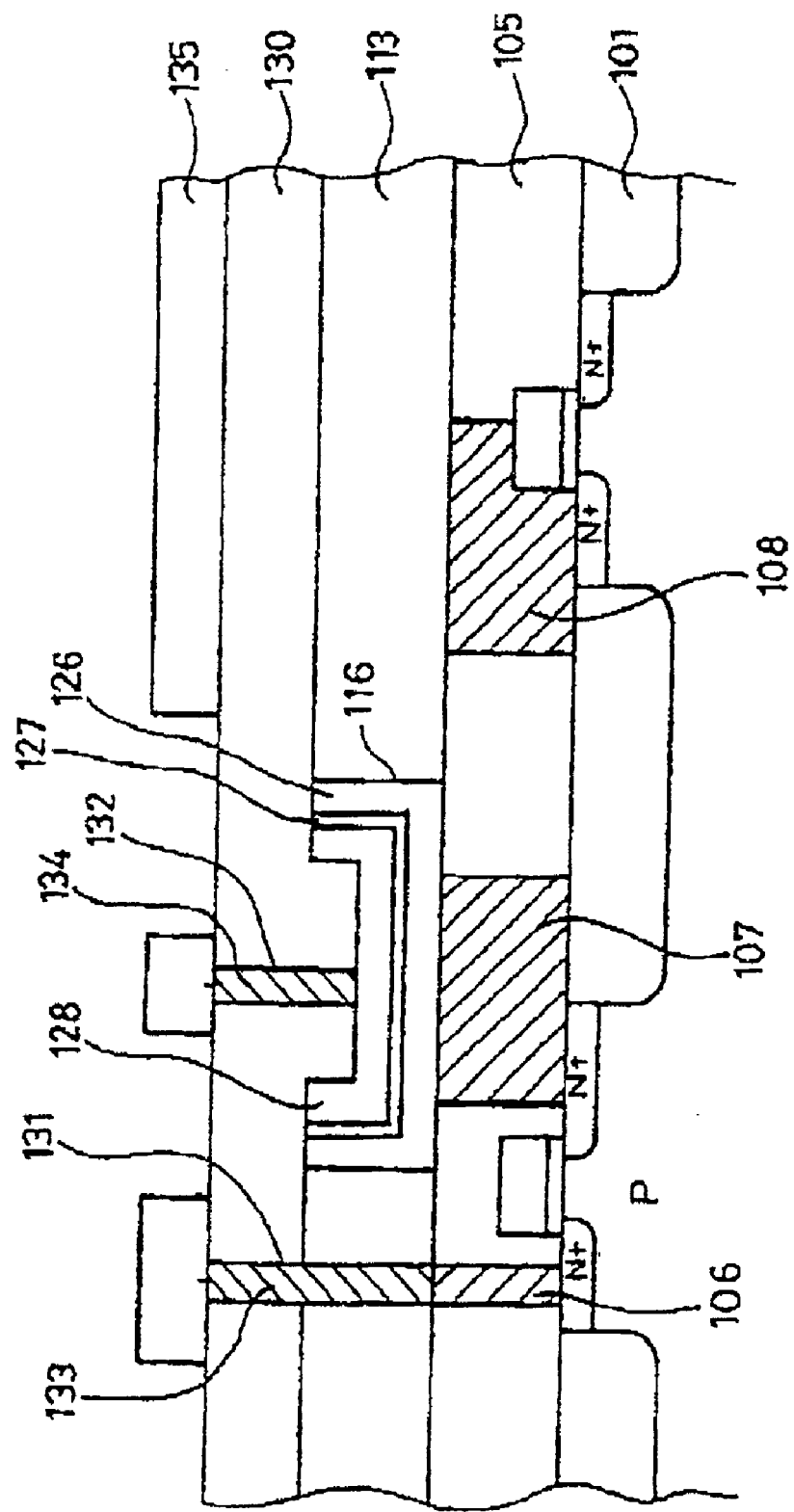
FIG. 6 shows in cross-section a further step in the fabrication of an integrated circuit in accordance with the preferred embodiment.

Preferred embodiments of the present invention will be described in detail hereinbelow with reference to the attached drawings. Like items are designated by the same reference numbers in the various figures. Also, as is the usual practice in representing integrated circuits, the various figures are not drawn to scale.

Preferred embodiments of the present invention provide integrated circuits that include active components and at least one passive component and methods of fabricating such integrated circuits. The present invention is particularly suited to the production of an integrated circuit that includes a plurality of active components and incorporates within it a plane of dynamic random access memory (DRAM) cells.

In one preferred embodiment, an integrated circuit includes a plurality of active components including junctions formed in a monocrystalline substrate doped locally and at least one passive component situated on top of the active components and electrically connected to at least one of the active components. A first insulating layer separates the active components and the base of the passive component. The electrical connection is made by a metal terminal formed in the thickness of the insulating layer and having a contact surface projecting from the limits of a junction of an active component.

In another embodiment of the present invention, an integrated circuit includes a plurality of transistors and passive components with a level of local metal connections formed within a first insulating layer deposited on top of the transistors of the integrated circuit. The integrated circuit includes three types of metal terminals passing completely through the thickness of the first insulating layer. The first type of terminal constitutes a first stage of contact between an active area of the integrated circuit and a first level of interconnection. The second type of terminal vertically connects an active area of the integrated circuit to a passive component resting on the first insulation. The third type of terminal horizontally connects two separate active areas of the integrated circuit.

Preferably, the second type of terminal advantageously has a contact surface projecting from the limits of a junction of an active component. The passive components can include capacitors and/or inductors. The final thickness of the first insulation layer is preferably greater than 0.3 micrometers, the top surface of the first insulation layer is preferably plane, and the metal terminals are preferably made principally of tungsten. In one advantageous embodiment, the passive component is set into a cavity formed throughout the thickness of a second layer of insulation deposited on top of the first layer of insulation. Preferably, the thickness of the second layer of insulation is greater than 2 micrometers.

Another preferred embodiment of the present invention provides an integrated circuit that includes an onboard memory plane of DRAM cells in a matrix, with each of the cells including a control transistor and a storage capacitor. The integrated circuit also includes a plurality of MOS transistors. A first level of interconnection is situated on top of the storage capacitors. A first layer of insulation separates the MOS transistors and the base of the storage capacitors. A level of local connections includes three types of metal terminals opening onto each side of the layer of insulation. The first type of terminal forms a first stage of contact between an active area of the integrated circuit and the first level of interconnection. The second type of terminal vertically connects an active area of the integrated circuit with one plate of the storage capacitor. The third type of terminal horizontally connects two separate active areas of the integrated circuit.

Preferably, the second type of terminal advantageously has a contact surface projecting from the limits of a junction of an active component. Some embodiments of the integrated circuit include a second layer of insulation situated on top of the first layer of insulation. A cavity passes through the entire thickness of the second layer of insulation and opens onto the top surface of the second type of terminal. The first electrode of a storage capacitor carpets the bottom and the inside flanks of the cavity. A third layer of insulation is also preferably provided on top of the second layer of insulation, and a contact opening preferably passes through the second and third layers of insulation and opens onto the top surface of the metal terminal of the first type.

Yet another preferred embodiment of the present invention provides a method of fabricating an integrated circuit that includes a plurality of MOS transistors and an onboard memory plane of DRAM cells in a matrix, with each of the cells consisting of a control transistor and a storage capacitor. According to the method, transistors are formed in a silicon substrate, and a first layer of insulation is deposited on top of the transistors. A polishing operation is used to produce a plane surface on the insulation. Cavities are formed through the insulating layer and filled with metal terminals so that the bottom part of a first type of terminal is in electrical contact with at least one component of the underlying integrated circuit, the bottom part of a second type of terminal is in electrical contact with a junction of the control transistor, and the bottom part of a third type of terminal is in electrical contact with components of the integrated circuit to be interconnected. A capacitor is formed on top of a terminal of the second type such that the bottom electrode of the capacitor is in electrical contact with the top part of the terminal of the second type.

In some embodiments, after forming the metal terminals, a second layer of insulation more than 2 micrometers thick is deposited on top of the first layer of insulation and the top surface of the metal terminals. Cavities are formed through the second insulating layer and as far as the top surface of a second type of terminal, and the electrodes of the storage capacitor are grown on the bottom of the cavity and on the flanks of the cavity.

One exemplary embodiment of the present invention will now be described in detail with reference to FIGS. 3–6. FIG. 3 shows a first step of a process for fabricating an integrated circuit that includes a plane of onboard DRAM cells. The left-hand part of FIG. 3 shows a control transistor T of the storage capacitor of a memory cell. The right-hand part of FIG. 3 shows any other transistor Ti of the integrated circuit, as an example of an active component. These two transistors are fabricated as follows in this exemplary embodiment.

Shallow trenches 101 filled with a dielectric material are formed in a P-type monocrystalline silicon substrate 100. A gate oxide 103 is formed. A layer of polycrystalline silicon is then deposited. After etching, the polycrystalline silicon forms the control gate 102 of the MOS transistors. The gate is insulated from the substrate by the gate oxide 103. Implantation of phosphorus or arsenic ions creates N-type doped monocrystalline silicon regions 104 in the monocrystalline silicon that is uncovered during implantation. This implantation also renders conductive the polycrystalline silicon that remains after the etching.

A first thick oxide 105 is then deposited. A chemical and mechanical polishing (CMP) operation produces a plane surface on the deposited oxide 105. In this exemplary embodiment, the oxide is approximately 0.4 microns thick. The thickness fluctuates according to the underlying relief of the circuit. Cavities 106a, 107a, and 108a are formed in the first thick oxide 105. Metal deposition followed by polishing produces metal (for example, tungsten)terminals 106, 107, and 108 only in the cavities 106a, 107a and 108a. The functions and the dimensions of the terminals are different.

Terminal 106 is a first stage of contact with the components of the integrated circuit. Terminal 107 provides a vertical connection between one of the two junctions of the control MOS transistor T of the DRAM cell and the first electrode of the storage capacitor (not yet formed) of the onboard DRAM cell. Terminal 108 provides a level of local interconnection. It is used to connect two closely spaced components of the integrated circuit. For example, terminal 108 can connect the gate 102 of the polycrystalline silicon MOS transistor Ti directly to an adjacent strongly doped monocrystalline silicon area. As another example, the terminal 108 can equally well connect two closely spaced but separate active areas, provided that there is no other component of the integrated circuit on the path of terminal 108.

FIG. 4 is a top view of a portion of the integrated circuit of FIG. 3. Rectangles 109 in FIG. 4 show the complement of the shallow trenches 101. These are the monocrystalline silicon active areas in which various components of the integrated circuit are formed. Rectangles 102 represent etched polycrystalline silicon. The metal terminals 106, 107, and 108 are also shown.

The characteristic dimension of terminal 106, the first contact stage, constitutes a parameter that determines the integration density of the integrated circuit. It should be as small as possible. The characteristic dimension of terminal 106 depends in practice on the minimum size authorized for the fabrication process that is used, and also on the thickness of the layer 105 that is etched before forming the terminal. The thinner the layer 105, the more precise the etching of this layer. In preferred embodiments of the present invention, the fabrication process reduces the thickness of the oxide 105, whose main function is to cover all the components of the integrated circuit and in particular the polycrystalline silicon 102.

The characteristic dimension of terminal 107, providing a vertical connection between the active area 109 and the bottom electrode of the storage capacitor of the DRAM cell (not yet formed), matches this particular connection configuration. Terminal 107 is preferably made as large as possible subject to the condition that no unwanted electrical contact is made between the various components of the integrated circuit.

The characteristic dimension of terminal 108, providing a level of local interconnection, matches the required connectivity. In the example of FIG. 4, terminal 108 establishes electrical contact between the gate of the MOS transistor Ti and a junction of the same MOS transistor Ti. It is equally possible to extend the terminal 108 toward other components of the integrated circuit, although this is not shown in the example of FIG. 4.

FIG. 5 represents another step in the fabrication of the integrated circuit in accordance with the exemplary embodiment of the present invention. This figure shows the production of the storage capacitor C of the onboard DRAM cell. A second layer 113 of insulation is deposited on the top surface of layer 105, in which the tungsten terminals 106, 107, and 108 have previously been formed. At this stage of the process, there are two stacked layers 105 and 113 of insulation. The two layers can be of different kinds so that they can be selectively etched with respect to each other. They can equally be of the same kind (for example, silicon oxide) and separated by a third layer (for example, silicon nitride). This kind of stack enables selective etching of layer 113, with the etching stopping in the intermediate layer.

A cavity 116 is then etched in the insulation 113. Because the etching is selective, the bottom of the cavity 116 is substantially plane and rests partly on the top surface of the tungsten terminal 107 and partly on the top surface of oxide layer 105. The storage capacitor C of the DRAM cell is then formed inside the cavity 116. The depth of the cavity partly determines the capacitance of the capacitor C. The thickness of the insulation 113 can be more than a few micrometers if the capacitor C is required to have a high capacitance.

Polycrystalline silicon is deposited so that it carpets the bottom and the sides of the cavity 116. This polycrystalline silicon constitutes the first plate 126 of the capacitor C. It must be strongly doped to reduce the contact resistances, in particular at the interface with the tungsten terminal 107. This doping requirement is easily satisfied since the thickness of the polycrystalline silicon to be doped is only that of the deposited polycrystalline silicon. There is no longer any relief effect, as in the conventional device, that would otherwise locally increase the thickness of polycrystalline silicon to be doped. Because of this, implantation of phosphorus followed by rapid thermal annealing (RTA) is sufficient (for example, for 20 seconds at 1,000° C.).

The thermal budget is low and an atom that diffuses easily is used. Thanks to the tungsten terminal 107, which creates a barrier to diffusion, phosphorus atoms from the polycrystalline layer 126 cannot penetrate as far as the very thin N junction of region 104 of the transistor T, and there is therefore no risk of interfering with it. The type of conductivity of the doping of layer 126 is immaterial, and not necessarily the same type as that of the junction in the monocrystalline silicon 100. A layer 127 of insulation (for example, silicon oxide or silicon nitride) is then deposited. A doped polycrystalline silicon second plate 128 is formed inside the cavity 116 and on top of layers 126 and 127. A CMP stage eliminates any surplus materials from the layers 126, 127, and 128 present on top of the insulation layer 113.

To reduce the contact resistances, the surfaces of the tungsten terminal 107 in contact with the monocrystalline silicon of region 104 and the plate 126 are preferably enlarged to use all of the available space without increasing the surface area of the memory cell. In particular, the production of the tungsten terminals is sufficiently well controlled to produce a terminal 107 projecting from the doped monocrystalline silicon of region 104. This was not the case in the conventional integrated circuit, where the contact was made via the polycrystalline silicon filling the hole 17 (FIG. 2) because direct contact between monocrystalline silicon and polycrystalline silicon is more difficult to control on an industrial scale.

Also, the vertical resistance of the tungsten terminal 107 relative to the vertical resistance of the polycrystalline silicon in the hole 17 of the conventional integrated circuit is very greatly reduced, because of the resistivity of the metal and because of the enlarged section of the terminal 107 relative to the hole 17. Note that this advantageous aspect of the present invention can equally be applied whenever a metal contact has to make an electrical connection between an active component of an integrated circuit (including a junction) and a passive component (such as a capacitor, a resistor, or an inductor) at a level higher than that of the active component.

FIG. 6 shows the next step in the fabrication of the integrated circuit including an onboard memory in accordance with the exemplary embodiment of the present invention. A thick third oxide layer 130 is deposited. A chemical and mechanical polishing (CMP) operation produces a plane surface on the deposited oxide 130. The oxide 130 is approximately 0.5 micrometer thick. Next, a contact opening 131 is etched through insulation 130 and 113 and another contact opening 132 is etched through insulation 130.

These openings are then filled with metal (for example, tungsten) terminals 133 and 134. The bases of the terminals 133 and 134 are respectively in electrical contact with the top part of tungsten terminal 106 and the polycrystalline silicon second plate 128 of the capacitor C. A metal (for example, aluminum) layer 135 is then deposited and etched, so as to constitute the first level of interconnection of the integrated circuit. Tungsten terminal 133 rests on terminal 106, and constitutes a second stage of contact with the components of the integrated circuit.

The technological operation for opening up the contacts of the integrated circuit is facilitated by the method according to the present invention, because it is effected in two stages and through thinner insulating oxide. This is particularly important because the presence of the capacitor C very significantly increases the vertical distances, because of the presence of the oxide layer 113. The present invention preferably avoids opening up contacts throughout the thickness of the three layers of insulation 105, 113, and 130, which would require an increase over the minimum design rules for the integrated circuit. Therefore, the component density of an integrated circuit in accordance with the present invention including an onboard DRAM can be significantly increased.

Many other embodiments of the present invention can be envisaged. Only the main steps of one exemplary method of fabricating an integrated circuit in accordance with the present invention have been described in detail. For example, the types of junction can be changed. Likewise, the active areas and the polycrystalline silicon can contain silicide and there is no limit on the number and the nature of the insulating layers. There is also no limit on the number and the nature of the levels of interconnection. Further, the technology used conjointly with the onboard DRAM cells can be any technology (for example, bipolar, JFET, and so on).

The present invention can be applied to any type of capacitor situated on top of active components of an integrated circuit and achieves a contact of high quality and low resistance, economic fabrication, and a saving of space in the circuit. Although the present invention has been described in detail with reference to a capacitor, it can clearly be applied in the same way to any type of passive component (such as a resistor or inductor) situated on top of active components of an integrated circuit, and also achieves a contact of high quality and low resistance, economic fabrication, and a saving of space in the circuit. For example, it is possible to substitute a copper inductor formed by a damascene process (using a similar cavity) for the capacitor formed in the exemplary fabrication process shown in the figures.

The present invention is therefore applicable to any type of passive component, including in particular polluting materials that cannot come into direct contact with monocrystalline silicon. For example, this applies to copper inductors and capacitors using perovskite (PZT) materials.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit including a plurality of transistors, a plurality of passive components, and a level of local metal connections formed within a first insulating layer that is deposited on top of the transistors of the integrated circuit, said integrated circuit comprising;

a first metal terminal constituting a first stage of contact between one active area of the integrated circuit and a first level of interconnection, having a lower surface that contacts the one active area of the integrated circuit, and having an upper surface that contacts a second stage of contact between the one active area of the integrated circuit and the first level of interconnection;

a second metal terminal vertically connecting one active area of the integrated circuit to a passive component that directly contacts the upper surface of the first insulating layer;

a third metal terminal horizontally connecting two separate active areas of the integrated circuit; and a second insulating layer above the first insulating layer, the passive component being set into a cavity formed throughout the thickness of the second insulating layer, wherein each of the first, second, and third metal terminals consists of a single layer of metal formed within a cavity passing completely through the thickness of the first insulating layer such that the metal terminal passes completely through the thickness of the first insulating layer.

2. The integrated circuit according to claim 1, wherein the second metal terminal has a lower surface that contacts a junction of one of the transistors of the integrated circuit such that the lower surface of the second metal terminal extends over a boundary of the junction of the one transistor.

3. The integrated circuit according to claim 1, wherein the passive components include capacitors.

4. The integrated circuit according to claim 1, wherein the passive components include inductors.

5. The integrated circuit according to claim 1, wherein the thickness of the first insulating layer is greater than 0.3 micrometers, the upper surface of the first insulating layer is plane, and the first, second, and third metal terminals are made of tungsten.

6. The integrated circuit according to claim 1, wherein the thickness of the second insulating layer is greater than 2 micrometers.

7. An integrated circuit comprising:
an onboard memory plane of DRAM cells in a matrix, each of the cells including a control transistor and a storage capacitor;
a plurality of MOS transistors;
a first level of interconnection above the storage capacitors;
a first insulating layer separating the MOS transistors and the base of the storage capacitors; and
a level of local connections including three metal terminals each opening onto each side of the first insulating layer, each of the three metal terminals consisting of a single layer of metal formed within a cavity passing completely through the thickness of the first insulating layer such that the metal terminal passes completely through the thickness of the first insulating layer,
wherein the first metal terminal forms a first stage of contact between one active area of the integrated circuit and the first level of interconnection, has an upper surface that contacts a second stage of contact between the one active area of the integrated circuit and the first level of interconnection, and extends from the one active area of the integrated circuit to the second stage of contact,
the second metal terminal vertically connects one active area of the integrated circuit with one plate of one of the storage capacitors, a lower surface of the one plate of the one storage capacitor extending over at least one boundary of an upper surface of the second metal terminal so that a portion of the lower surface of the one plate rests on the upper surface of the second metal terminal and the remainder of the lower surface of the one plate rests on the upper surface of the first insulating layer,
the third metal terminal horizontally connects two separate active areas of the integrated circuit, and
the integrated circuit further comprises:
a second insulating layer above the first insulating layer; and
a cavity passing through the entire thickness of the second insulating layer, the one storage capacitor being set into the cavity.

8. The integrated circuit according to claim 7, wherein the second metal terminal has a lower surface that contacts a junction of the one active area such that the lower surface of the second metal terminal extends over a boundary of the junction of the one active area.

9. The integrated circuit according to claim 7,
wherein the one plate of the one storage capacitor carpets the bottom and the inside flanks of the cavity.

10. The integrated circuit according to claim 9, further comprising:
a third insulating layer above the second insulating layer; and
a contact opening passing through the second insulating layer and the third insulating layer and opening onto the upper surface of the first metal terminal.

11. The integrated circuit according to claim 7, wherein the first, second, and third metal terminals are made of tungsten.

12. An information processing system including at least one integrated circuit, the integrated circuit comprising:
an onboard memory plane of DRAM cells in a matrix, each of the cells including a control transistor and a storage capacitor;
a plurality of MOS transistors;
a first level of interconnection above the storage capacitors;
a first insulating layer separating the MOS transistors and the base of the storage capacitors; and
a level of local connections including three metal terminals each opening onto each side of the first insulating layer, each of the three metal terminals consisting of a single layer of metal formed within a cavity passing completely through the thickness of the first insulating layer such that the metal terminal passes completely through the thickness of the first insulating layer,
wherein the first metal terminal forms a first stage of contact between one active area of the integrated circuit and the first level of interconnection, has an upper surface that contacts a second stage of contact between the one active area of the integrated circuit and the first level of interconnection, and extends from the one active area of the integrated circuit to the second stage of contact,
the second metal terminal vertically connects one active area of the integrated circuit with one plate of one of the storage capacitors, a lower surface of the one plate of the one storage capacitor extending over at least one boundary of an upper surface of the second metal terminal so that a portion of the lower surface of the one plate rests on the upper surface of the second metal terminal and the remainder of the lower surface of the one plate rests on the upper surface of the first insulating layer, and
the third metal terminal horizontally connects two separate active areas of the integrated circuit, and
the integrated circuit further comprises:
a second insulating layer above the first insulating layer; and
a cavity passing through the entire thickness of the second insulating layer, the one storage capacitor being set into the cavity.

13. The information processing system according to claim 12, wherein the second metal terminal has a lower surface that contacts a junction of the one active area such that the lower surface of the second metal terminal extends over a boundary of the junction of the one active area.

14. The information processing system according to claim 12,
wherein the one plate of the one storage capacitor carpets the bottom and the inside flanks of the cavity.

15. The information processing system according to claim 14, wherein the integrated circuit further comprises:
a third insulating layer above the second insulating layer; and
a contact opening passing through the second insulating layer and the third insulating layer and opening onto the upper surface of the first metal terminal.

16. The information processing system according to claim 12, wherein the first, second, and third metal terminals are made of tungsten.

17. The integrated circuit according to claim 1, wherein the first insulating layer is a single layer and the only insulating layer provided between the transistors and a base of the passive component.

18. The integrated circuit according to claim 1, wherein the third metal terminal is a local horizontal interconnection that directly connects two separate active areas of the integrated circuit.

19. The integrated circuit according to claim 1, wherein the second metal terminal has an upper surface that contacts a base of the passive component, and a lower surface of the base of the passive component extends over at least one boundary of the upper surface of the second metal terminal so that a portion of the lower surface of the base of the passive component rests on the upper surface of the second metal terminal and the remainder of the lower surface of the base of the passive component rests on an upper surface of the first insulating layer.

* * * * *

UNITED STATES PATENT AND TRADEMARK OFFICE
CERTIFICATE OF CORRECTION

PATENT NO.    : 6,958,505 B2
DATED         : October 25, 2005
INVENTOR(S)   : Catherine Mallardeau et al.

It is certified that error appears in the above-identified patent and that said Letters Patent is hereby corrected as shown below:

<u>Title page,</u>
Item [57], ABSTRACT,
Line 6, change "abase" to -- a base --.

Signed and Sealed this

Third Day of January, 2006

JON W. DUDAS
*Director of the United States Patent and Trademark Office*